(12) United States Patent
Finkenzeller et al.

(10) Patent No.: US 9,851,399 B2
(45) Date of Patent: Dec. 26, 2017

(54) METHOD AND APPARATUS FOR CHECKING A CIRCUIT

(71) Applicant: GIESECKE & DEVRIENT GMBH, Munich (DE)

(72) Inventors: Klaus Finkenzeller, Unterfohring (DE); Michael Baldischweiler, Munich (DE)

(73) Assignee: GIESECKE+DEVRIENT MOBILE SECURITY GMBH, Munich (DE)

( * ) Notice: Subject to any disclaimer, the term of this patent is extended or adjusted under 35 U.S.C. 154(b) by 259 days.

(21) Appl. No.: 14/766,201

(22) PCT Filed: Feb. 5, 2014

(86) PCT No.: PCT/EP2014/000311
§ 371 (c)(1),
(2) Date: Aug. 6, 2015

(87) PCT Pub. No.: WO2014/121928
PCT Pub. Date: Aug. 14, 2014

(65) Prior Publication Data
US 2016/0146886 A1    May 26, 2016

(30) Foreign Application Priority Data

Feb. 7, 2013  (DE) ................ 10 2013 002 139
Feb. 7, 2013  (DE) ................ 10 2013 002 140

(51) Int. Cl.
  *G01R 31/315*  (2006.01)
  *H04B 5/00*  (2006.01)
  *H04B 17/16*  (2015.01)

(52) U.S. Cl.
  CPC ......... *G01R 31/315* (2013.01); *H04B 5/0075* (2013.01); *H04B 17/16* (2015.01)

(58) Field of Classification Search
  CPC ..... H04B 17/16; H04B 5/0075; G01R 31/315
  (Continued)

(56) References Cited

U.S. PATENT DOCUMENTS 3,659,197 A    4/1972  Alley et al.
5,926,768 A *  7/1999  Lewiner ................ H04B 7/005
                                                 455/506

(Continued)

FOREIGN PATENT DOCUMENTS

DE    10117249 A1    11/2002
DE    10325446 B3    3/2005

(Continued)

OTHER PUBLICATIONS

Finkenzeller, Klaus; RFID Handbook—Fundamentals and Applications in Contactless Smart Cards, Radio Frequency Identification and Near-Field Communication; 2010; Published by Wiley; 3rd Edition; p. 263-266; 9.2.4.2-9.2.4.2.3.*

(Continued)

*Primary Examiner* — Melissa Koval
*Assistant Examiner* — Rahul Maini
(74) *Attorney, Agent, or Firm* — Justin Cassell; Workman Nydegger

(57) ABSTRACT

A method for checking a circuit devised for contactless data communication, which comprises an antenna and an electronic component coupled with the antenna, comprises the following steps: generating an alternating magnetic field of a field strength, and arranging the circuit in the alternating field region. Then the electronic circuit is excited by means of an energy pulse. In a further step, an oscillation of the circuit in response to the excitation of the circuit by the energy pulse is captured. The captured oscillation of the circuit is finally evaluated, in particular with regard to a self-resonant frequency of the circuit.

19 Claims, 7 Drawing Sheets

(58) Field of Classification Search
USPC .............. 324/600–628, 637–647, 654–657; 340/12.51, 13.26
See application file for complete search history.

(56) References Cited

U.S. PATENT DOCUMENTS 6,236,220 B1   5/2001   Enguent
8,072,310 B1   12/2011  Everhart

FOREIGN PATENT DOCUMENTS

DE   102006022160 B3   12/2007
WO      2005086279 A1    9/2005
WO      2009018790 A1    2/2009

OTHER PUBLICATIONS

German Search Report for corresponding German Application No. 102013002139.1, dated Sep. 27, 2013.
German Search Report for corresponding German Application No. 102013002140.5, dated Oct. 31, 2013.
International Search Report for corresponding International PCT Application No. PCT/EP2014/000311, dated May 2, 2014.

* cited by examiner

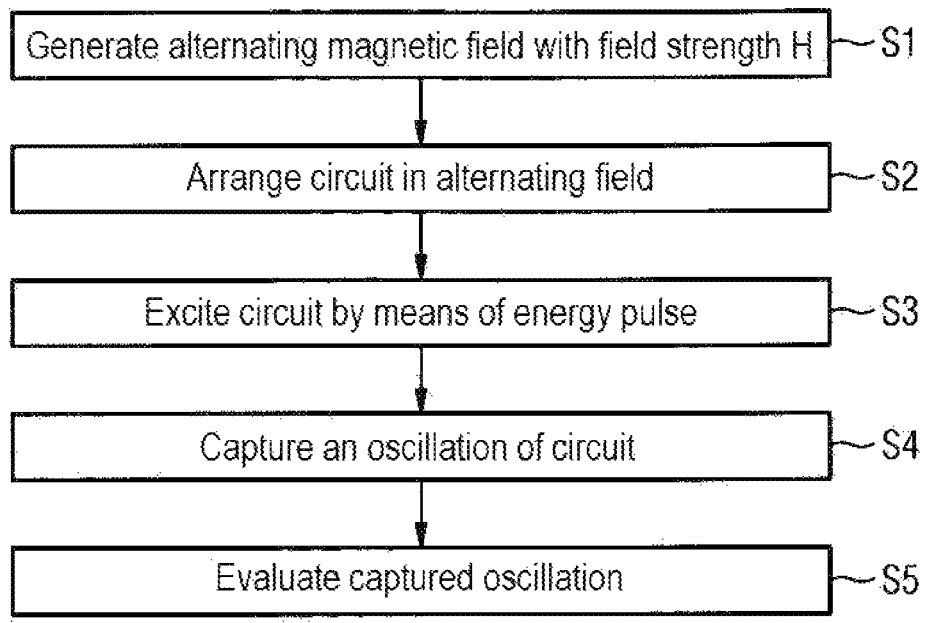
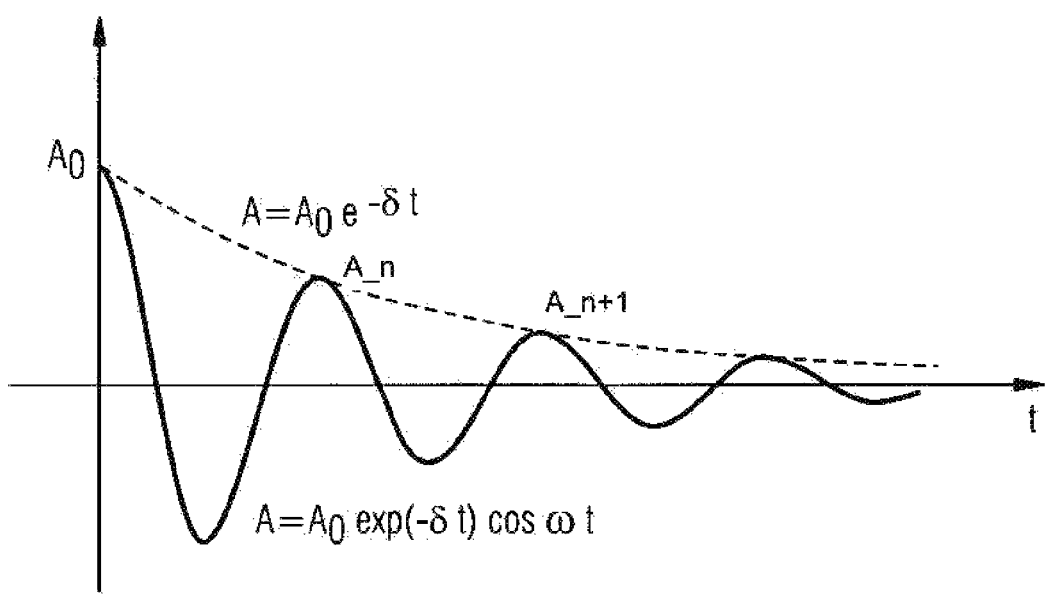

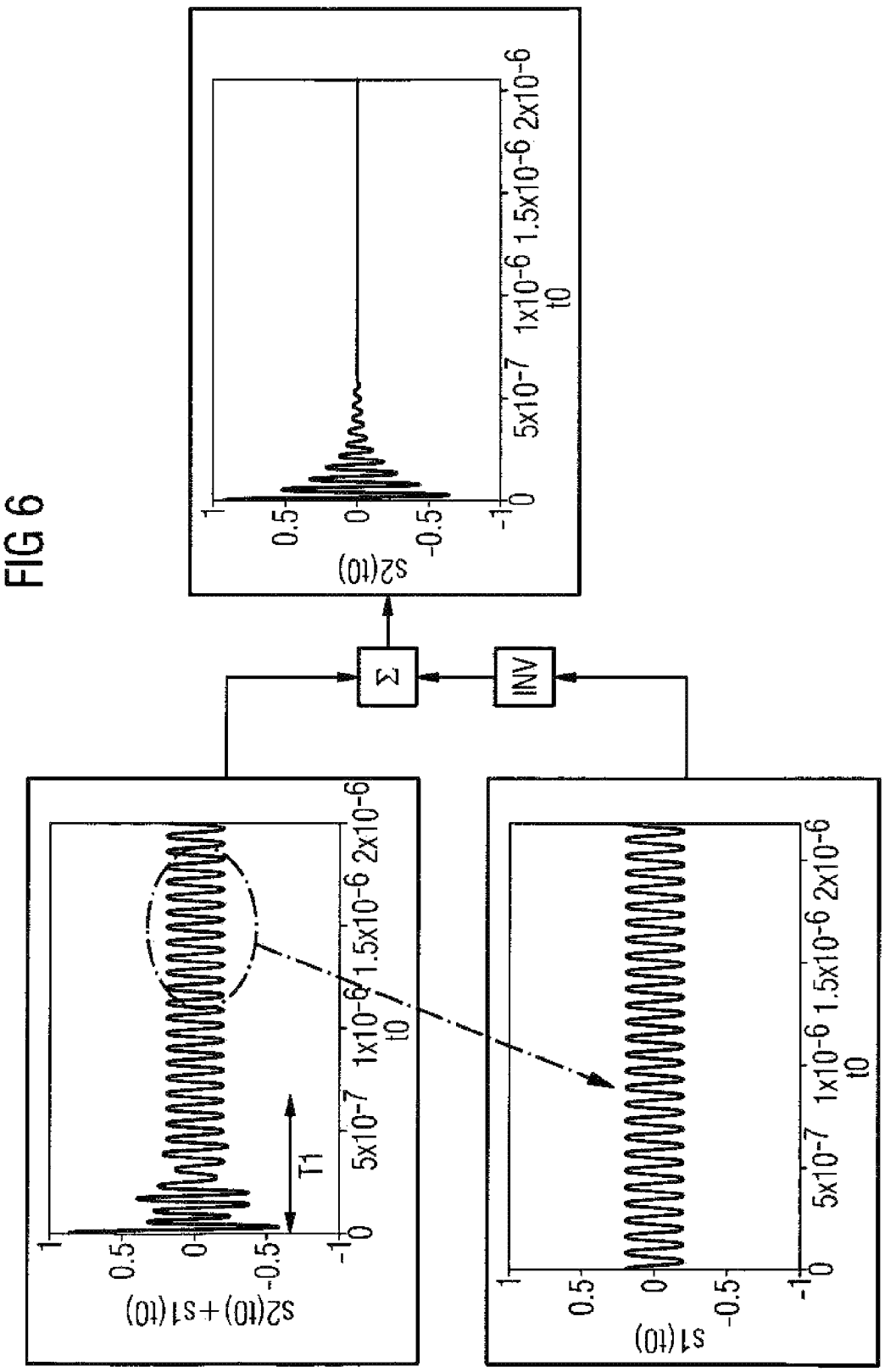

METHOD AND APPARATUS FOR CHECKING A CIRCUIT

BACKGROUND

The present invention relates to a method and a measuring apparatus for checking a circuit devised for contactless data communication, which comprises an antenna and an electronic component coupled with the antenna.

The checking of the circuit can relate to both electronic properties of the circuit and the functionality of the circuit or individual parts of the circuit.

Portable data carriers, such as national identity cards, passports, credit cards, labels for authenticating goods or the like, can be equipped with an antenna, for example in the form of an antenna coil, for contactless data communication with a reading device. The antenna coil is thus as a rule connected to an electronic component of the data carrier, in particular a chip, and applied, for example imprinted, on a carrier layer or inlay layer, for example made of a plastic material such as PC or PVC, of a data-carrier body of the data carrier.

Alternatively, a corresponding circuit can also be devised to be integrated into an end device, such as a mobile radio end device, a smartphone or a reader. The circuit can in particular be designed as an RFID or NFC module which is intended to be firmly integrated into an end device of the stated kind.

To check the functionality of an antenna coil during or after the manufacture of the corresponding data carrier or device, various methods are known. Such a check substantially involves checking whether the antenna coil has a break and/or whether two or more coil turns of the antenna are inadvertently short-circuited. Defects of this kind considerably impair the functionality of the antenna coil, or destroy it completely. A check of the circuit, consisting of the antenna and the electronic component connected to the antenna, can also relate to the functionality of the component or of individual parts of the component, as mentioned hereinabove.

Concurrently with production, a check of the antenna coil has hitherto usually been effected in the form of a direct-current resistance measurement. Such a checking method is elaborate, since a contacting of the antenna coil is required. Further, only certain defects of the checked circuit can be recognized. A malfunctioning of one or more parts of the electronic component or a conducting path break in certain regions of the antenna are not, or hardly, recognizable in this manner.

Alternatively, the resonance frequency of the antenna coil and its quality factor can be determined contactlessly. For this purpose, a phase and impedance analyzer is employed as a rule. Such a, very elaborate, method is described in detail for example in "RFID-Handbuch" by Klaus Finkenzeller, 6th edition, Carl Hanser Verlag, Munich, 2012, in chapter 4.1.11.2. When the measured resonance frequency lies in a pre-specified range, the antenna coil is functional. This kind of check is more informative than a purely ohmic measurement, but far more elaborate and best carried out manually. The time duration of such a check lies in the range of several seconds. Hence, this check is not carried out concurrently with production as a rule, but merely on some random samples and for production release. Further, properties of the analyzer, for example the impedance of a measuring antenna, can influence the result of the measurement. Different analyzers hence lead to deviating measuring results as a rule.

SUMMARY

The object of the present invention is therefore to propose a method and a measuring apparatus for a fast, simply carried out, cost-efficient and reproducible check of a circuit, in particular with regard to its self-resonant frequency and/or quality factor.

One basic idea of the present invention is that the circuit to be checked is excited to oscillate by means of an energy pulse, and the circuit's oscillation generated by the excitation is captured and evaluated. From the captured oscillation it is then possible, as described in detail hereinafter, to determine properties of the circuit, such as the self-resonant frequency or the quality factor of the circuit.

The present invention is further based on the finding that electrical properties of a circuit to be checked, in particular the self-resonant frequency and the quality factor of the circuit, are dependent on the field strength of an alternating magnetic field in which the circuit is located during or shortly before the measurement, i.e. the excitation by the energy pulse. Since known methods have hitherto ignored this influence variable, exact and reproducible measurements of corresponding properties have not been possible.

One reason for the field strength dependence of the resonance frequency and of the quality factor of a transponder, which is assumed here by way of example as the electronic circuit to be checked, lies in the physical properties of electronic parts of the transponder. For obtaining a supply voltage of a transponder chip, the transponder antenna is connected to a rectifier component. The rectifier's impedance seen by the transponder antenna depends on the current flowing into the rectifier. Further influence variables are voltage-dependent barrier layer capacitances of the rectifier component as well as, where applicable, transistor components on the transponder chip, the dynamic direct-current and alternating-current resistance of the rectifier component as well as a resultant input capacitance of the transponder chip. In other words, the resonance frequency of the transponder depends indirectly on an alternating magnetic field in which the transponder is located during the measurement for the stated reasons.

A method according to the invention for checking a circuit devised for contactless data communication, which comprises an antenna and an electronic component coupled with the antenna, hence comprises the following steps:

The electronic circuit is excited by means of an energy pulse. In a further step, an oscillation of the circuit in response to the excitation of the circuit by the energy pulse is captured. The captured oscillation of the circuit is finally evaluated, in particular with regard to a self-resonant frequency of the circuit.

The method according to the invention is characterized, inter alia, in that the evaluating of the captured oscillation is effected in dependence on the field strength of an alternating magnetic field in which the circuit is arranged.

The evaluating of the captured oscillation can be effected in particular in dependence on an operating or switching state of one or more parts of the electronic component that is due to the presence of the alternating magnetic field. The mentioned operating or switching states can relate for example to the charge of a capacitor or the current flow through a rectifier component.

A concrete embodiment of the method according to the invention therefore comprises the further steps of generating an alternating magnetic field, preferably of constant or pre-specified field strength, and of arranging the circuit in the alternating field. The two steps are carried out before the step of exciting the circuit by means of the energy pulse.

The circuit is arranged in the generated alternating magnetic field at least during the exciting. The alternating field thus remains switched on. In particular, the circuit is already arranged in the generated alternating magnetic field before the exciting and at least during the capturing. Preferably—before the exciting or after the capturing of the oscillation of the circuit in response to the excitation—the oscillation of the circuit is captured in the alternating field without excitation.

In an alternative embodiment, the generating of the alternating magnetic field is interrupted temporarily. The magnetic field is thus switched off and switched on again for the circuit. In particular, the new switch-on is effected after the capturing of the oscillation.

As a rule, the exciting of the circuit is effected as inductive exciting by means of a pulsed magnetic field. Said magnetic field is not to be confused with the hereinabove mentioned alternating magnetic field.

The magnetic field that is generated in the step of exciting the circuit is preferably generated by a single current pulse. The current pulse can preferably be generated as a direct-current pulse in the form of a Dirac impulse. Alternatively, there can also be generated a current pulse merely having a steep edge.

Preferably, the exciting of the circuit is effected contactlessly by means of an external exciting coil. The capturing of the oscillation of the circuit, on the other hand, is effected likewise preferably contactlessly by means of an external measuring antenna. Exciting coil and measuring antenna are preferably arranged in immediate proximity of the circuit to be checked.

Further, measuring antenna and exciting coil are preferably arranged orthogonally to each other, as described in detail hereinafter.

The antenna of the circuit is preferably an inductively coupling antenna, i.e. in particular an RFID or NFC antenna coil. In particular, the antenna can be an antenna coil with at least one conductor loop.

The alternating magnetic field can be generated by means of a transmitting antenna. Further, it can be provided to measure the field strength of the alternating field in a pre-specified range by means of a calibrating antenna, in order to enable a generating of the alternating field according to the pre-specified field strength in a precise and verifiable manner.

The calibrating antenna and the antenna of the circuit to be checked are preferably arranged relative to the transmitting antenna such that an alternating magnetic field of the same field strength is respectively present in the region of the calibrating antenna and in the region of the antenna of the circuit. This makes it possible for the check of the circuit to be carried out in an exactly pre-specifiable, standardized environment, i.e. with an alternating magnetic field present in a pre-specified field strength. This for the first time allows a very precise and reproducible measurement of the corresponding physical properties of the circuit, in particular of the resonance frequency and the quality factor of the circuit.

An alternative way of calibration is to measure the calibrating antenna—like the circuit later—and to determine a field strength-dependent property of the calibrating antenna. The generated field strength is so adjusted that the measured property of the calibrating antenna assumes a pre-specified value for said property. Thus, the generated field strength corresponds to the pre-specified field strength. For the calibrating antenna (coil), the steps of additionally exciting with a pulse, capturing the resultant oscillation and determining the property are thus performed within the context of evaluating the captured oscillation. This measurement of the property of the calibrating antenna is repeated with adapted field strength until the measurement yields the pre-specified property value of the calibrating antenna.

The alternating magnetic field is generated here such that the circuit arranged therein is set in sinusoidal oscillation that is constant with regard to amplitude and frequency. The frequency preferably corresponds to an operating frequency of the circuit. In the case of a contactlessly communicating chip card, this can be for example a frequency of 13.56 MHz.

According to a preferred embodiment of the method according to the invention, the circuit, as described, is arranged in the region of the alternating magnetic field and the alternating field is present in a constant manner at the time of exciting the circuit by means of the energy pulse. In other words, the exciting of the circuit by the energy pulse is effected with the alternating magnetic field switched on lastingly. Upon the evaluating of the captured oscillation, that component of the captured oscillation that is brought about by the alternating field is then taken into consideration. This is the hereinabove mentioned, constant sinusoidal oscillation.

Within the context of this embodiment, the capturing of the oscillation of the circuit comprises a capturing of a superimposition of a sinusoidal oscillation of the circuit brought about by the alternating field, with a free, damped oscillation of the circuit resulting from the excitation of the circuit by the energy pulse.

The evaluating of the captured oscillation of the circuit can be effected by means of a subtraction of the constant sinusoidal oscillation from the captured oscillation. In this manner the free, damped oscillation can be ascertained.

To support such a procedure, the sinusoidal oscillation can be captured before the exciting by the energy pulse, or at a sufficient lag after exciting, i.e. when the free, damped oscillation has already decayed, and be ascertained with regard to amplitude, phase and frequency and stored in an evaluation device.

The subtraction of the constant sinusoidal oscillation from the captured oscillation of the circuit can be effected by means of software or by means of hardware. In the hardware variant, an amplifier can be employed. The described subtraction can then preferably be effected by addition of a signal which corresponds to the signal captured by the calibrating antenna and then inverted, i.e. by addition of the inverted sine oscillation.

A circuit excited by an energy pulse dies out after excitation in principle immediately with a free, damped oscillation A(t), which can be described by the following formula:

$$A(t) = A_0(t) e^{(-\delta t)} \cos \omega t$$

A(t) can correspond to the current I or the voltage U of an electrical oscillating circuit formed by the circuit. Therefore, the voltage pattern of the circuit immediately after excitation can be described by the following formula:

$$U(t) = U_0(t) e^{(-\delta t)} \cos \omega t$$

The circular frequency $\omega$ corresponds to the self-resonant frequency of the circuit $f_{res}$ multiplied by $2\pi$ ($\omega = 2\pi f_{res}$). From the decay coefficient $\delta$ and the self-resonant frequency $f_{res}$ one can ascertain the quality factor Q of the circuit.

Alternatively, the quality factor Q can also be ascertained from two consecutive maxima $A_n$ and $A_{n+1}$ of the oscillation amplitude of the circuit.

$$Q = \frac{\pi * f_{res}}{\delta} = \frac{\pi}{\ln\left(\frac{A_n}{A_{n+1}}\right)}$$

The longer the decay phase lasts, the higher the quality factor of the corresponding oscillating circuit is. That is to say, an evaluation of the free, damped oscillation of the circuit, i.e. its dying-out immediately after excitation, allows both the self-resonant frequency and the quality factor of the circuit to be determined.

One aspect of the present invention relates, as mentioned, to a precise measurement of the self-resonant frequency of the circuit under pre-specified external conditions, i.e. in an alternating magnetic field of constant, pre-specified field strength. This allows a corresponding measurement in a reproducible manner and in particular with an operating field strength of the circuit.

A further aspect of the invention is now based on the fact that a defect of the antenna of the circuit to be checked, such as an interruption of a conducting path or a short circuit between individual coil turns of an antenna designed as an antenna coil, has the result that a dying-out signal pattern recognizable upon a described check differs significantly from a corresponding dying-out signal pattern of an intact antenna coil. Parameters of a faulty antenna that are ascertained on the basis of the evaluated free, damped oscillation, in particular the antenna's self-resonant frequency and quality factor, differ clearly from the corresponding parameters of an intact antenna.

A conducting path break, for example, becomes apparent in a clearly recognizable change in dying-out behavior, in particular a changed, as a rule elevated, self-resonant frequency. In the case of a short circuit of two or more coil turns, there is hardly any more dying-out to be observed.

In this way it can not only be recognized upon evaluation of the free, damped oscillation by the checking apparatus whether or not the antenna coil is faulty but it also possible in the case of a fault or defect to ascertain the type of fault or the nature of the defect.

A third aspect of the invention finally relates to the fact that if an intact circuit is present, there should respectively be ascertained at different field strengths mutually deviating resonance frequencies, even though they might only deviate slightly. In other words, when the described method is carried out repeatedly and the same resonance frequencies are ascertained—at different field strengths of the alternating magnetic field—this indicates a defect of the electronic component or of those elements of the component that in principle contribute to a dependence of resonance frequency on field strength.

The advantages of the method according to the invention are evident and numerous.

For the first time, the resonance frequency can be ascertained precisely and reproducibly, under variably, but firmly adjustable conditions. A hitherto uncapturable influence of an alternating magnetic field on measuring results can now be precisely pre-specified and taken into consideration in the measurement. This enables a precise measurement of physical properties of the circuit under unambiguously reproducible measurement conditions.

Further, the check of the antenna can be effected contactlessly and with very low time expenditure. For suitable embodiments, such as chip cards with printed antenna coils, this allows a check during an ongoing production process. In particular, a printed antenna coil that has not yet completely cured can also already be checked with the method according to the invention. The required measuring apparatus, which will be described in detail hereinafter, can be made available comparatively simply and cost-efficiently. Moreover, the method not only allows physical properties of the circuit to be determined in a reproducible manner, and errors or defects of a defective antenna to be recognized, but also different types of error to be distinguished in a circuit to be checked.

According to a variant of the method according to the invention, the circuit can be arranged in the region of the alternating magnetic field, and the alternating field be switched off at the time of exciting the circuit by means of the energy pulse. The switching off of the alternating field is effected at such a short time before the exciting of the circuit by the energy pulse that influences of the previously present, still switched-on alternating field on operating and switching states of one or more parts of the electronic component are still present. That is, the circuit is still supplied with energy at the time of exciting. In other words, the alternating magnetic field is switched off at least briefly and the exciting of the circuit by the energy pulse is effected with the alternating magnetic field switched off. This variant has the advantage that the evaluating of the captured oscillation is simpler due to the fact that no oscillation component corresponding to the sinusoidal oscillation has to be subtracted from the captured signal.

As mentioned, the alternating magnetic field is preferably switched off only briefly. The duration of the switch-off of the alternating magnetic field is so short that the circuit to be checked remains supplied with energy during the switch-off of the alternating field. Preferably, the switch-off only lasts a few microseconds, preferably about 3 μs (for example for data carriers according to ISO/IEC 14443).

Further, the exciting of the circuit by means of the energy pulse within the context of the hereinabove described alternative, i.e. with the alternating field briefly switched off, is preferably effected only when the sinusoidal oscillation resulting from the formerly present, switched-on alternating field has already decayed. Only then does the hereinabove described advantage of simpler evaluation of the captured oscillation result to the full extent. In this case the captured oscillation of the circuit corresponds exactly to the free, damped oscillation of the circuit that results from the excitation of the circuit by the energy pulse.

As mentioned, in the step of evaluating the free, damped oscillation of the circuit captured or ascertained as described hereinabove, there is ascertained in particular the self-resonant frequency of the circuit and the quality factor of the circuit in dependence on the field strength of the alternating magnetic field present. As described, inferences about the functionality of the circuit can be drawn therefrom in many ways.

It will be appreciated that the method can be repeated with respectively changed field strength of the alternating magnetic field in each of the described variants, as likewise mentioned hereinabove. In this manner it is in particular possible to verify the dependence of the measuring results on the field strength. For example, identical measuring results at different field strengths indicate a defective circuit.

Common field strengths at which the method can be repeated are in particular those corresponding to an operating field strength of a contactless communicating data carrier of the hereinabove mentioned variants, i.e. field strengths in the range of 0 to 12 A/m, particularly preferably between 1.5 and 7.5 A/m or between 0.15 and 7.5 A/m.

A measuring apparatus according to the invention for checking a circuit devised for contactless data communication comprises the following components:

A transmitting device having a transmitting antenna is devised to generate an alternating magnetic field of a pre-specified frequency and a constant (pre-specified) field strength.

A pulse generator is devised to excite a circuit to be checked, which is arrangeable in the measuring apparatus, contactlessly via an exciting coil attached to the pulse generator.

A measuring antenna is devised to capture an oscillation of an arranged circuit to be checked.

An evaluation device, finally, which is connected to the measuring antenna is devised to evaluate, in particular with regard to a self-resonant frequency of the circuit, the oscillation of the circuit to be checked that is captured by the measuring antenna.

The evaluation device can, in so doing, in particular draw on a comparison with reference values of an intact antenna coil. For analyzing the signals captured by the measuring antenna upon capture of the oscillation there can be used in the known manner for example a digital signal processor (DSP) or an oscilloscope.

According to a preferred embodiment, the measuring apparatus can comprise a calibrating device having a calibrating antenna. The calibrating device is devised to capture parameters of the alternating magnetic field generated by the transmitting device, in particular a field strength of the alternating field in the region of the calibrating antenna. Alternatively, a calibration of the measuring apparatus can also already be effected during the manufacture of the measuring apparatus. In this case the calibrating device is expendable during the checking of the circuit.

Preferably, the measuring apparatus is devised such that the circuit to be checked, which, as mentioned, comprises an antenna and an electronic component coupled with the antenna, can be arranged in the measuring apparatus such that the antenna of the circuit is arranged in a region in which the alternating field has a pre-specified field strength. Said region is, as mentioned, preferably respectively ascertainable in an exact manner by means of the calibrating antenna.

Concretely, this can be effected for example by the circuit to be checked being arranged in the measuring apparatus such that the antenna of the circuit and the calibrating antenna are arranged coaxially with the transmitting antenna. Further, the antenna of the circuit and the calibrating antenna are arranged on respectively different sides of the transmitting antenna. Finally, the distance at which each of the two antennas is arranged from the transmitting antenna is respectively the same. A comparable checking arrangement is known for example from the standard ISO/IEC 10373-6 in connection with the measurement of a field strength-dependent load modulation amplitude.

The exciting coil and the measuring antenna of the measuring apparatus are preferably arranged orthogonally to each other. In the case that the exciting coil and the measuring antenna are not arranged orthogonally to each other, but for example side by side, the exciting pulse of the exciting coil is also captured by the measuring antenna. Moreover, the exciting coil's decay behavior is then superimposed on the antenna coil's decay behavior to be measured.

Upon an "orthogonal" arrangement of the exciting coil relative to the measuring antenna, the two lie relative to each other such that the signal of the exciting coil is not perceived by the measuring antenna. The exciting coil is so arranged spatially vis-à-vis the measuring antenna that substantially no signal is coupled into the measuring antenna. A signal is coupled into a coil whenever the contour integral over the magnetic flux $\phi$ through said coil is greater than zero (cf. above-cited "RFID-Handbuch", chapters 4.1.6 and 4.1.9.2). The integral over the magnetic flux $\phi$ is zero exactly when magnetic field lines of different direction and field strength in the measuring antenna cancel each other out across the total area, or when the angle of the field lines to the coil axis amounts to exactly 90°—hence the term "orthogonal" arrangement. A suitable, so-called coplanar orthogonal arrangement of the exciting coil relative to the measuring antenna can be effected for example such that the two antennas lie partly one over the other suitably in a plane.

The transmitting device of the measuring apparatus is preferably devised to generate an alternating magnetic field of different field strengths. As mentioned hereinabove, this should include at least field strengths in the range of the common operating field strengths of contactlessly communicating data carriers or devices, i.e. field strengths in the range of 0 to 12 A/m, in particular in the range of 1.5 to 7.5 A/m for ISO/IEC 14443 or 0.15 to 7.5 A/m for ISO/IEC 15693.

The generated magnetic field and the circuit are preferably provided or devised for a communication in the near zone, i.e. by means of inductive coupling or load modulation. In particularly preferred embodiments, the checking is effected during an ongoing data communication with the circuit. The generated alternating field is employed for data communication with the circuit. The steps of exciting and capturing are effected in a phase of the communication when no modulation of the alternating field is effected or in a phase of the communication when briefly no alternating field is generated.

The measuring antenna of the measuring apparatus should preferably be designed such that it does not, or not substantially, influence the measurement of the oscillation of the circuit to be checked itself through its physical properties. For this purpose, the measuring antenna should be designed to be as broad-band as possible and have merely a very slight excessive voltage rise in the range of its resonance frequency. In particular, a dying-out of the measuring antenna in reaction to the excitation by means of the exciting coil, which can in principle also be perceived by the measuring antenna, should be substantially suppressed.

To obtain this, the measuring antenna comprises according to a preferred embodiment a conductor loop and a plurality of ohmic resistors, with resistors being inserted into the conductor loop at pre-specified distances. In other words, the insertion of the resistors into the conductor loop gives rise to a plurality of line segments of the conductor loop which are connected by the ohmic resistors. Line segments and resistors are respectively switched alternatingly and in series.

In this manner there arises a conductor loop having a high-ohmic resistance switched in series therewith. This could in principle also be obtained by switching a single high-ohmic resistor in series with the conductor loop. However, since in practice one must also consider parasitic capacitances forming along the conductor loops, the described construction of the preferred measuring antenna has various advantages. Since the resistance is not present as a single resistor but as a plurality of "partial resistors"

switched along the conductor loop, the parasitic capacitances that occur no longer take effect as a total capacitance. In other words, while a single resistor which would be switched in series with the conductor loop, on account of a parasitic capacitance occurring along the conductor loop, which would then appear as a total capacitance, would form together with the inductance of the conductor loop an oscillating circuit with an unfavorably high quality factor—because of the high-ohmic apparent resistance—the described, preferred construction allows an effective damping of the measuring antenna.

Compared with an embodiment in which the resistance is distributed "evenly" along the conductor loop by the conductor loop of the measuring antenna being made of a high-ohmic material, such as graphite, the described construction has the advantage of a simple and in particular more cost-efficient manufacture.

The distances between any pair of resistors inserted adjacently along the conductor loop are preferably regular. The number, the distance and the dimension of the resistors are in principle variable. Preferably, at least five resistors are arranged along the conductor loop, preferably 8 to 10 resistors, but the number can also be greater. As a rule, the resistors are identically dimensioned, with deviations between individual resistance values being possible.

Preferably, an amplifier is arranged immediately at the measuring antenna. This can avoid a long feed line with capacitance. The amplifier preferably comprises a high-ohmic input. As an amplifier there can be employed for example an impedance transducer. The output impedance thereof is then preferably adapted to a transfer means which connects the impedance transducer to the evaluation device. As a connection means there is preferably employed a coaxial cable. In this case the output impedance of the impedance transducer amounts to 50Ω.

The evaluation device, which can be for example an oscilloscope, preferably has an input impedance which is adapted in the same manner to a transfer means which connects the evaluation device to the measuring antenna, for example the stated coaxial cable.

BRIEF DESCRIPTION OF THE DRAWINGS

The present invention will hereinafter be described by way of example with reference to the attached drawings. Therein are shown:

FIG. 3 steps of a preferred embodiment of a method according to the invention for checking a circuit devised for contactless data communication;

FIG. 4 the pattern of a free, damped oscillation;

FIG. 6 by way of example, substeps of the evaluation of the captured oscillation from FIG. 5;

DETAILED DESCRIPTION OF VARIOUS EMBODIMENTS

Figure 1:
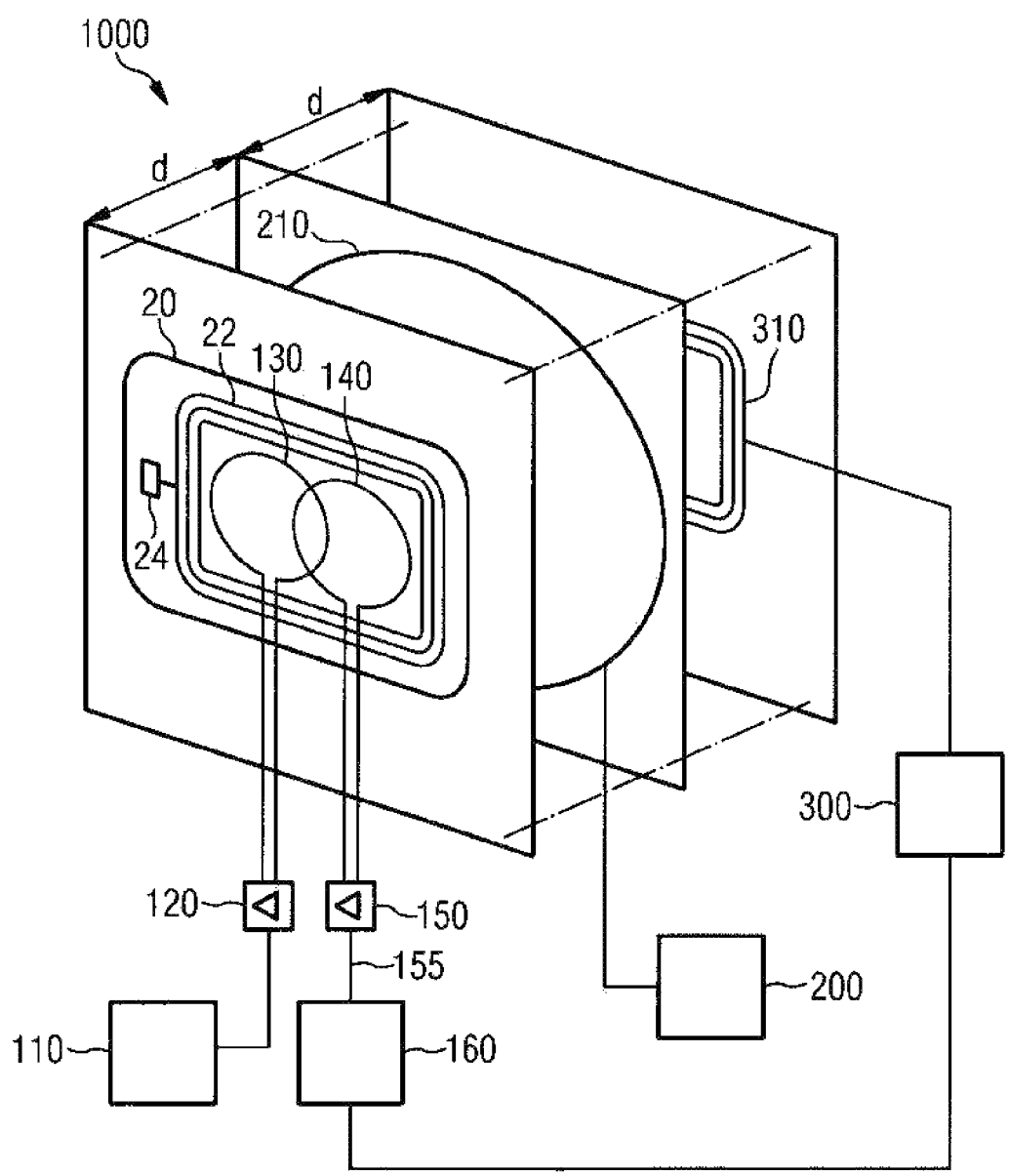
FIG. 1 a preferred embodiment of a measuring apparatus according to the invention.

The measuring apparatus 1000 represented by way of example in FIG. 1 serves for checking a circuit 20 devised for contactless data communication, which is represented in the present example in the form of a contactlessly communicating chip card. It comprises an antenna coil 22 which is connected to an electronic component 24 to form a circuit 20 to be checked.

The antenna 22 of the circuit 20, when the circuit is arranged for checking in the measuring apparatus, is arranged coaxially with a transmitting antenna 210 of a transmitting device 200 of the measuring apparatus 1000.

Likewise coaxially with the transmitting antenna 210 is arranged a calibrating antenna 310 of a calibrating device 300. The calibrating device 300 having the calibrating antenna 310 can be part of the measuring apparatus 1000. The calibrating antenna 310 as well as the antenna 22 of the circuit 20 to be checked are arranged, as illustrated, on respectively different sides of the transmitting antenna 210 and at respectively the same distance d from the transmitting antenna 210.

By means of the transmitting device 200 and the transmitting antenna 210 there can be generated an alternating magnetic field of an adjustable field strength H and with a pre-specified frequency. In particular, the transmitting device 200 is devised to generate an alternating magnetic field with an operating field strength H usual for the operation of a data carrier 20 to be checked. In connection with data carriers according to ISO/IEC 14443, usual operating field strengths are for example 1.5 to 7.5 A/m. Preferably, the region that the transmitting device 200 covers comprises a greater interval, for example 0 to 12 A/m, preferably even higher field strengths.

The calibrating device 300 having the calibrating antenna 310 serves for exactly capturing the field strength H of the alternating field generated by means of the transmitting device 200, at a defined distance d from the transmitting antenna 210. Due to the fact that the antenna 22 of a data carrier 20 to be checked can be arranged in the measuring apparatus 1000 relative to the transmitting antenna 210 in the same spatial arrangement, coaxially, and at the same distance d as the calibrating antenna 310, it can be assumed that exactly the same field strength H is present in the region of the antenna 22 of the circuit 20 to be checked as in the region of the calibrating antenna 310.

The measuring apparatus 1000 further comprises a pulse generator 110 which is preferably connected via an amplifier 120 to an exciting coil 130. By means of an energy pulse generated by the pulse generator 110, preferably in the form of a Dirac impulse, the circuit 20 to be checked can be excited contactlessly via the exciting coil.

A measuring antenna 140 of the measuring apparatus 1000 is devised to capture an oscillation of the circuit 20 to be checked and relay it preferably via an amplifier 150 to an evaluation device 160. The evaluation device 160 can be present for example as an oscilloscope and is preferably connected to the calibrating device 300, as described hereinafter with reference to FIG. 6.

Exciting coil 130 and measuring antenna 140 are arranged at a suitable, preferably small distance beside the antenna 22 of the circuit 20 to be checked, on the side of the data carrier 20 facing the transmitting antenna or, as illustrated in FIG. 1, on the side thereof facing away from the transmitting antenna 210.

Figure 2A:
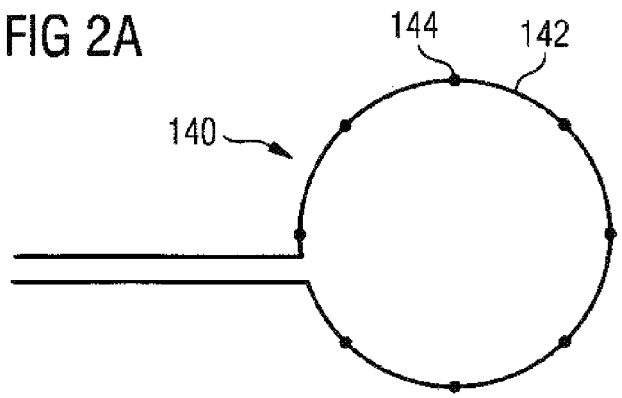
FIG. 2A a preferred embodiment of a measuring antenna of the measuring apparatus from FIG. 1.

FIG. 2A shows a preferred embodiment of the measuring antenna 140 from FIG. 1. The measuring antenna 140 comprises a conductor loop and a plurality of ohmic resistors 144, with the resistors 144 being inserted into the conductor loop at pre-specified distances. There result line segments 142 which, as illustrated, are switched in series with the resistors 144. The distances between adjacent resistors 144 along the conductor loop are preferably respectively the same. The number of the resistors 144 or of the line segments 142 is variable. As a rule, all of the resistors 144 are identically dimensioned. As resistors 144 there can be employed for example SMD resistors solderable directly onto the conducting paths.

Figure 2B:
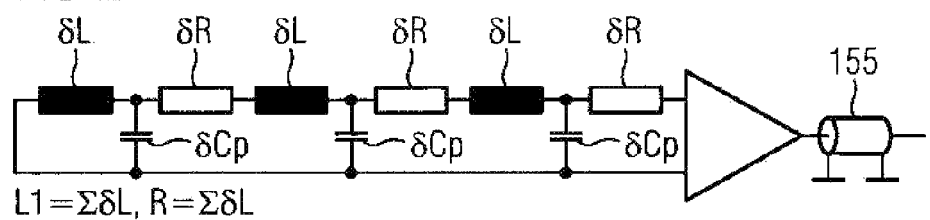
FIG. 2B an equivalent circuit of the measuring antenna from FIG. 2A.

FIG. 2B shows an equivalent circuit diagram of the measuring antenna 140 from FIG. 2A. Therein the symbolically shown resistors δR correspond to the ohmic resistors 144, the elements δL add up to the inductance L1 of the conductor loop, and the parasitic capacitances forming along the conductor loop are designated with δCp. Due to the fact that the resistors 144 are arranged so as to be distributed substantially evenly along the conductor loop, the parasitic capacitances δCp do not take effect as a total capacitance Cp, thereby enabling the measuring antenna 140 to be effectively "damped".

To obtain a favorable coupling out of signals, the signal captured by means of the measuring antenna 140 should be coupled out in as high-ohmic a manner as possible. Hence, an amplifier 150 with a high-ohmic input is arranged immediately at the measuring antenna 140, as represented in FIG. 1. Preferably, there is used as an amplifier 150 an impedance transducer. The latter preferably possesses an output impedance of 50Ω and is connected by means of a coaxial cable 155 to the evaluation device 160, for example an oscilloscope. The latter should preferably have an input impedance of 50Ω Reflections can thereby be effectively avoided.

A further advantage of the measuring antenna 140 from FIG. 2A is that, due to the high resistance of the conductor loop and an accordingly high input resistance of the impedance transducer, the current in the measuring antenna tends to zero. In other words, practically only voltage is measured at the terminals of the measuring antenna 140. When the current in the measuring antenna 140 becomes very small, this also minimizes a back-effect on the antenna 22 of the circuit 20 to be checked. Thus, the measuring result is practically not influenced by the measuring antenna 140.

Figure 2C:
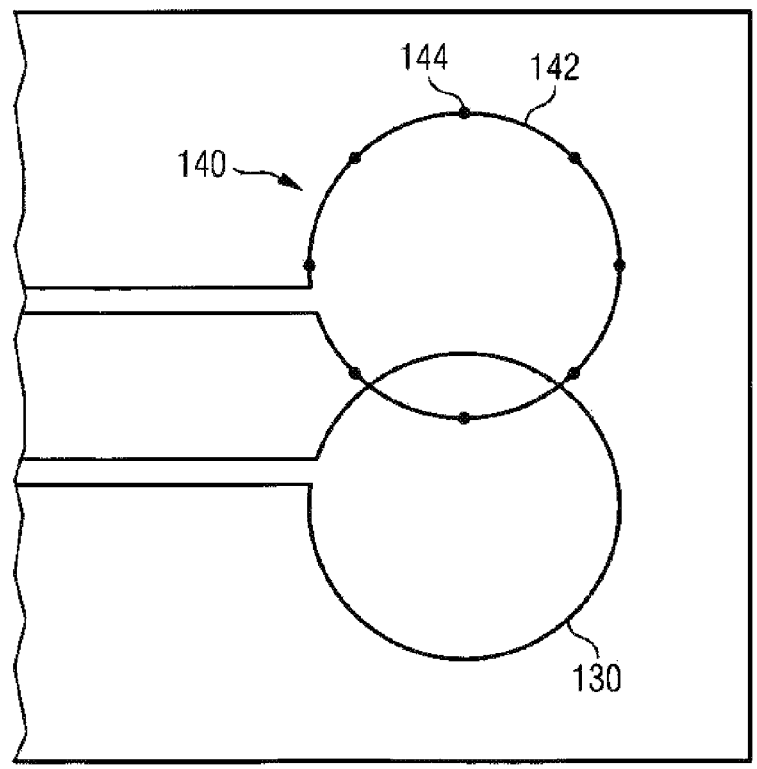
FIG. 2C an arrangement of the measuring antenna from FIG. 2A relative to an exciting coil of the measuring apparatus from FIG. 1.

FIG. 2C shows a preferred embodiment of an arrangement of the measuring antenna 140 relative to the exciting coil 130. Measuring antenna 140 and exciting coil 130 are arranged orthogonally to each other here. As described hereinabove, this has the effects that no signal of the exciting coil 130 is coupled into the measuring antenna 140 if possible. The exciting coil 130 and the measuring antenna can be arranged on a suitable, planar carrier.

FIG. 3 indicates essential steps of a preferred embodiment of a method for checking a circuit 20 devised for contactless data communication.

In a first step S1 an alternating magnetic field with a pre-specified, defined field strength H is generated. This can be effected by means of the transmitting device 200 explained with reference to FIG. 1.

In step S2 the circuit 20 is arranged in the region of the alternating field. As a rule, the circuit 20 is arranged in the generated alternating field. The arrangement is effected such that the field strength H is exactly adjustable in the region of the antenna 22 of the circuit 20 to be checked, as was likewise described with reference to FIG. 1. However, the circuit 20 can also already be arranged in the region of the alternating field to be generated before the generating step S1. This order of steps is expedient for example when the exact field strength was already adjusted in advance (e.g. upon checking of the nth data carrier of the same kind) or it is unnecessary to keep to the exact field strength for the check (e.g. when checking data carriers of the same kind for conformance or for a reference value while employing the preconfigured checking apparatus).

In step S3 the circuit 20 is excited by means of an energy pulse. This can be effected by means of the exciting coil 130 from FIG. 1 through interaction with the pulse generator 110. Exciting is preferably effected inductively by means of a pulsed magnetic field, with the magnetic field preferably being generated by a single current pulse in the form of a Dirac impulse.

In step S4 an oscillation of the circuit 20 in response to the exciting of the circuit 20 is captured. This is done using the measuring antenna 140 from FIG. 1 or FIG. 2A.

In step S5 the captured oscillation is evaluated by an evaluation device, for example the evaluation device 160 from FIG. 1.

The evaluating step S5 comprises determining the check result. The captured oscillation and/or values determined therefrom can be matched with pre-specifications (predetermined references). In particular, a value can thus be compared with a reference value. Pre-specified tolerances are taken into consideration in step S5. In particular, there are determined in the evaluating step S5 properties of the circuit, such as quality factor and/or self-resonant frequency.

Arranging the circuit 20 in the alternating field according to step S2 sets the circuit 20 in sinusoidal oscillation that is constant with regard to amplitude and frequency, due to the transmitting frequency of the transmitting antenna 210.

Exciting the circuit 20 by means of the energy pulse according to step S3 results in a free, damped oscillation of the circuit 20, as is represented by way of example in FIG. 4.

It should be noted at this point that in connection with the present invention the term "exciting" the circuit is to be employed exclusively in connection with exciting the circuit by means of the energy pulse (step S3). The influence of the alternating magnetic field, which likewise has an effect on the oscillation behavior of the circuit, is not understood here as "exciting" the circuit as intended by the invention.

FIG. 4 shows the theoretical pattern of a free, damped oscillation A(t) in the course of time t. The function A(t) can correspond to the current I or the voltage U. The circular frequency ω corresponds to the self-resonant frequency of the corresponding circuit 20 multiplied by 2 π. From the decay coefficient δ one can determine the quality factor of the circuit 20.

Figure 5:
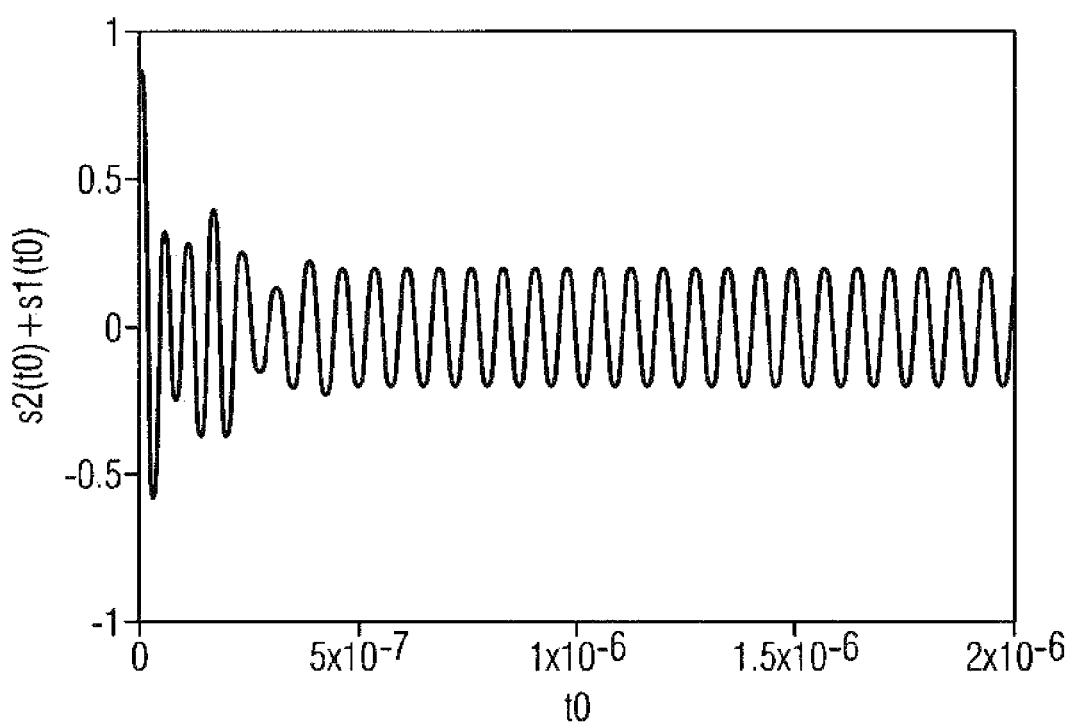
FIG. 5 by way of example, the pattern of an oscillation as can be captured in step S4 from FIG. 3.

FIG. 5 shows a superimposition of the mentioned, constant sinusoidal oscillation with a free, damped oscillation of the circuit 20. Such a signal can be captured by the measuring antenna 140 in step S4. To ascertain a resonance frequency of the circuit 20 to be checked from an oscillation as is represented in FIG. 5, that component of the oscillation that corresponds to the constant sinusoidal oscillation that is generated by the alternating magnetic field must be subtracted from the captured oscillation. A possible procedure for carrying out such an evaluation is illustrated in FIG. 6.

The pattern of the free, damped oscillation can be captured for example by means of the calibrating antenna 310 and be analyzed and stored by the evaluation device 160. For this purpose, the calibrating device 300 is connected to the evaluation device 160. The analyzing step can be effected before the exciting of the circuit 20 by means of the energy pulse or, as illustrated in FIG. 6, at a sufficient time lag after the exciting of the circuit 20 by the energy pulse, i.e. when the free, damped oscillation has already decayed. A corresponding time span is designated as T1 in FIG. 6. To subtract the sinusoidal oscillation from the captured total signal, said oscillation is inverted and added to the captured oscillation, as is represented by way of example in FIG. 6. In the right subfigure is represented the result, i.e. the free, damped oscillation of the circuit 20 as results from the excitation of the circuit 20 by the energy pulse.

Figure 7A:
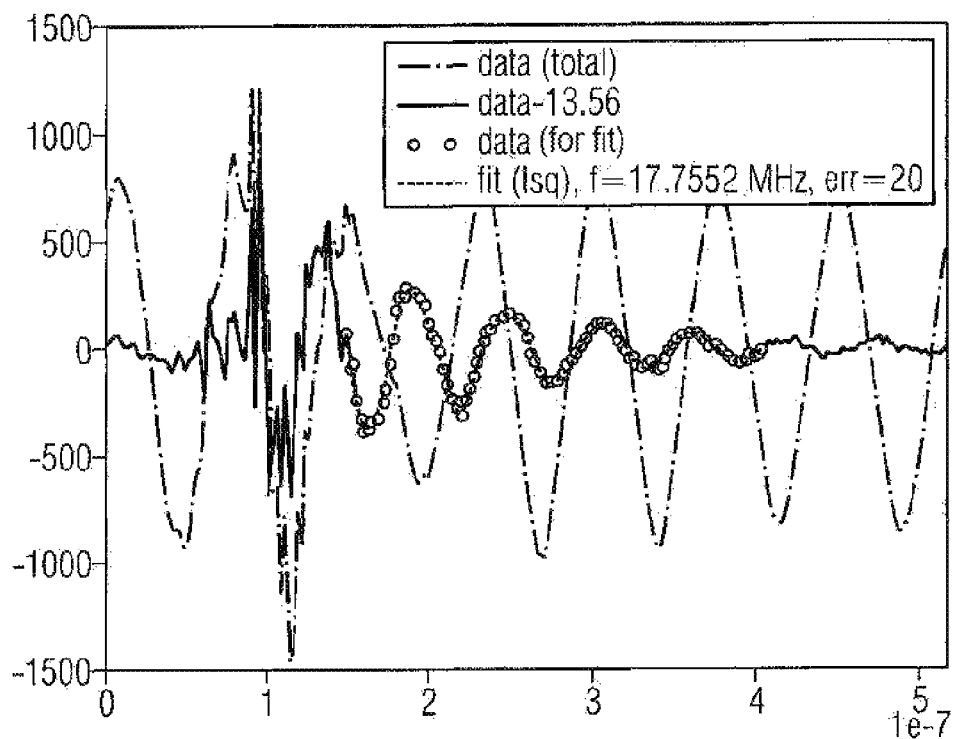
FIGS. 7A and 7B by way of example, the ascertaining of an operating resonance frequency of a circuit to be checked.

An example of a measurement of an operating resonance frequency of a circuit to be checked is represented in FIG. 7A. The captured total signal, i.e. the sinusoidal oscillation superimposed with the free, damped oscillation, is represented as a dot-dashed line. After the capturing of said signal the sinusoidal component corresponding to the constant alternating field was subtracted. The resultant signal is represented by a continuous line and shows in a clear manner the decay of the free, damped oscillation after a Dirac impulse. Finally, FIG. 7A shows the result after application of a fit algorithm, with a dashed line, with employed data points being made visible.

Figure 7B:
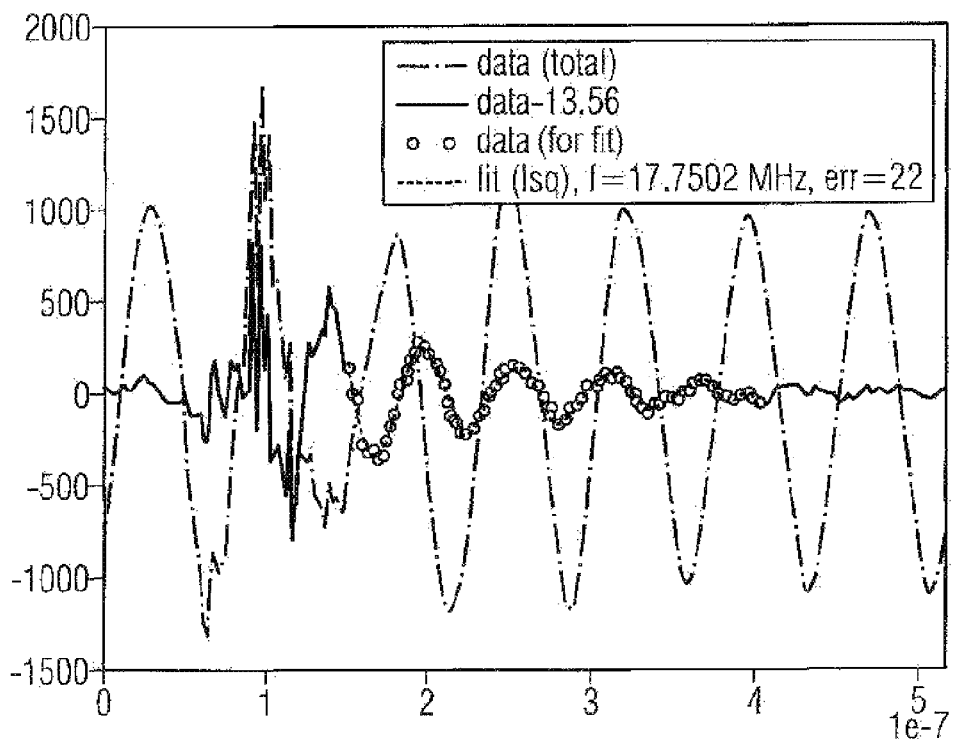

A second measurement of the resonance frequency of the same circuit 20, but with a different second constant field strength H', is represented in FIG. 7B. It is apparent that the resonance frequency of the circuit 20 differs by approx. 200 kHz compared with the first measurement, with the first field strength H. This is to be attributed to the field strength dependence of the resonance frequency of the circuit 20.

Figure 8A:
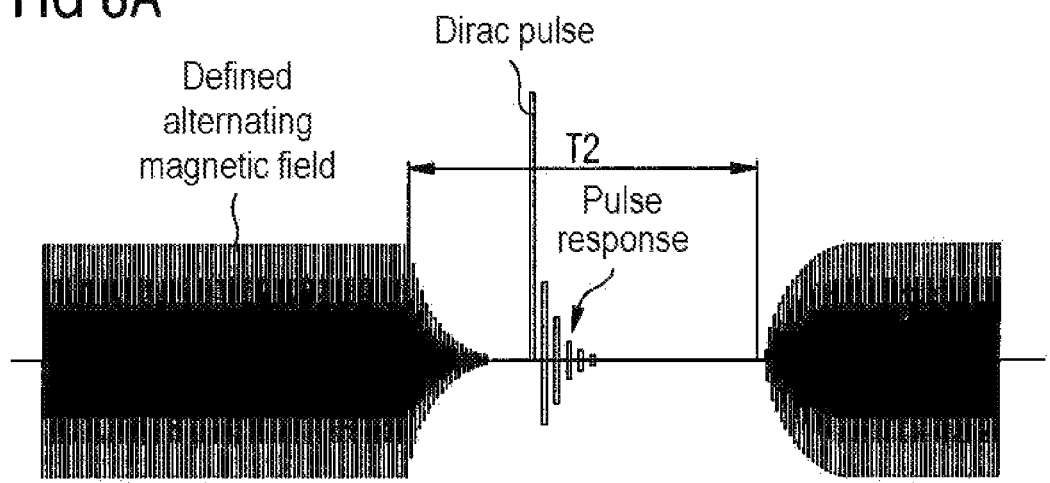
FIG. 8A a captured signal according to a variant of the method of FIG. 3.

With reference to FIG. 8A, the signal pattern of a signal captured by the measuring antenna 140 according to an alternative checking method is represented. As illustrated with reference to FIG. 8B, the alternative method presented here is the same in steps S1 to S5 as the method described hereinabove with reference to FIGS. 3 and 5 to 7.

The alternative checking method forming the basis here deviates from the hereinabove described checking method in that the alternating magnetic field is switched off at least briefly (cf. step S2a in FIG. 8B).

While the exciting of the circuit 20 (step S3 in FIG. 3) was effected within the context of the method described with reference to FIGS. 5 to 7 while the alternating magnetic field was switched on, i.e. was present at constant field strength H, the exciting is effected according to the variant represented with reference to FIGS. 8A and 8B with the magnetic field switched off.

As illustrated in FIG. 8A, the alternating magnetic field is preferably switched off only briefly, for example for a time duration T2, which can amount to for example approx. 3 μs. In this pause there is effected the exciting of the circuit 20 by means of the energy pulse, for example a Dirac pulse. Since the pulse is effected very shortly after the switching off of the alternating magnetic field, the circuit 20 is still sufficiently supplied with energy, so that switching and operating states of different elements of the circuit 20 have substantially the same state as at a constantly present alternating field. The measuring result, i.e. the ascertained resonance frequency of the circuit 20, will hence practically not differ, or differ at most negligibly, in comparison to a measurement with the alternating field switched on lastingly.

Figure 8B:
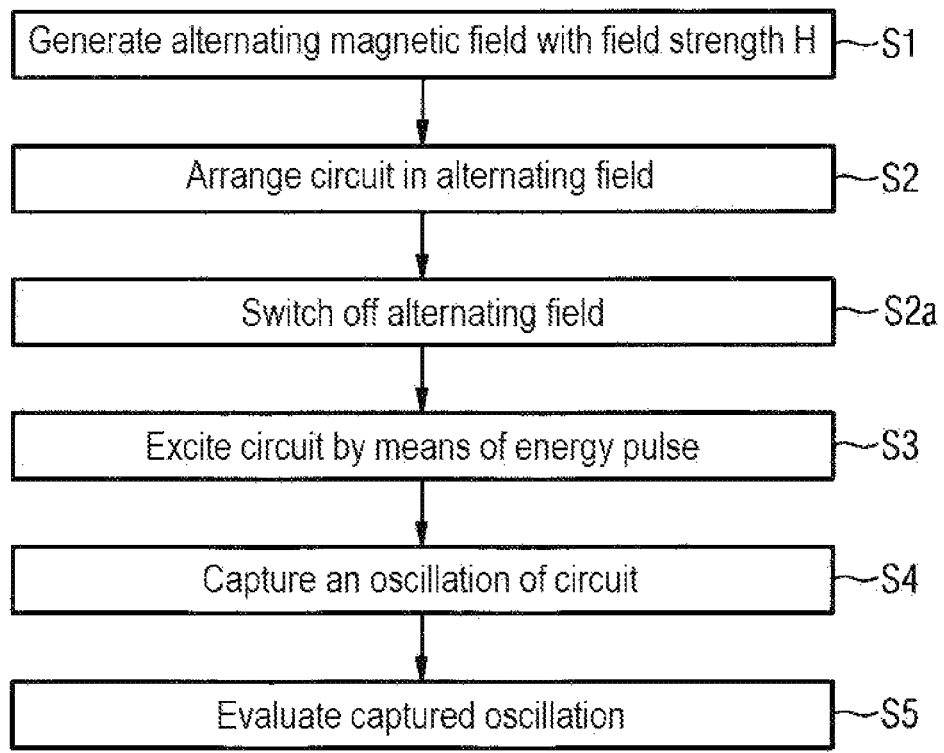
FIG. 8B the steps of a method according to said variant.

For the way the alternative method from FIG. 8B works, it is not essential when and whether the alternating magnetic field is switched on again. There need in principle be no new switching on. As a rule, however, the switch-off will be only very brief, as described hereinabove. This allows for example a multiple repetition of the check in a simple manner.

Preferably, the exciting of the circuit within the time span when the alternating field is switched off is effected only when the sinusoidal oscillation that has been brought about by the alternating field has decayed, as is represented in FIG. 8A.

This variant of the checking method has the advantage of simplifying the evaluating of the captured oscillation in response to the exciting of the circuit 20 by the energy pulse. As represented in FIG. 8A, the oscillation captured in step S4 from FIG. 8B already corresponds according to the present variant to only the free, damped oscillation of the circuit 20. Therefore, a subtraction of further, captured oscillation components can be dispensed with.

Hereinafter, further aspects of the present invention will be specified in a linked list. Within the context of the check of the circuit there is determined a property of the circuit that is dependent on the field strength of the alternating field. A method for determining a property of a circuit (20) devised for contactless data communication, which comprises an antenna (22) and an electronic component (24) coupled with the antenna (22), includes the steps of: generating (S1) an alternating magnetic field of a field strength for the circuit (20); exciting (S3) the circuit (20) by means of an energy pulse; capturing (S4) an oscillation of the circuit (20) in response to the excitation by the energy pulse; and evaluating (S5) the captured oscillation of the circuit (20); wherein in the evaluating step (S5) the field strength-dependent property of the circuit (20) is determined for the generated field strength.

The method is characterized in that in the generating step (S1) a pre-specified field strength is generated, and that the pre-specified field strength is adjusted while employing a calibrating antenna (310). While employing a calibrating antenna (310) there is determined the position at which the circuit (20) is arranged (S2) in the region of the alternating field. The pre-specified field strength is measured on the calibrating antenna (310). The field strength is adapted until a property of the calibrating antenna that is determined for the calibrating antenna—by means of previous steps of generating, exciting, capturing and evaluating for the calibrating antenna—reaches a calibrating value. There is determined as the property of the circuit (20) a self-resonant frequency and/or a quality factor.

A measuring apparatus (1000) for determining a property of a circuit (20) devised for contactless data communication, with the measuring apparatus comprising: a transmitting device (200) having a transmitting antenna (210), with the transmitting device (200) being devised to generate an alternating magnetic field of a pre-specified frequency and a field strength (H); a pulse generator (110) which is devised to contactlessly excite a circuit (20) to be checked, which is arrangeable in the measuring apparatus (1000), via an exciting coil (130) attached to the pulse generator (110); a measuring antenna (140) which is devised to capture an oscillation of the circuit (20); and an evaluation apparatus (160) which is connected to the measuring antenna (140) and is devised to determine from the oscillation of the circuit (20) that is captured by the measuring antenna (140) the field strength-dependent property of the circuit (20) for the generated field strength.

The measuring apparatus (1000) is characterized by a calibrating device (300) for adjusting the field strength to a pre-specified field strength. For adjusting the field strength to a pre-specified field strength a calibrating antenna (310)

is employed. The calibrating device (300) is devised to capture parameters of the alternating field generated by the transmitting device (200), in particular a field strength (H) in the region of the calibrating antenna (310).

The measuring apparatus is devised to determine the generated field strength by exciting the calibrating antenna (310) by means of the pulse generator (110), capturing the oscillation of the calibrating antenna (310) by means of the measuring antenna (140), and evaluating the captured oscillation for the calibrating antenna by means of the evaluation device (160), and is devised to adjust the generated field strength to the pre-specified field strength. The measuring apparatus (1000) is devised such that the circuit (20) to be checked, which comprises an antenna (22) and an electronic component (24) coupled with the antenna (22), can be arranged in the measuring apparatus (1000) such that the antenna (22) of the circuit (20) is arranged in a region in which the alternating field has a pre-specified field strength (H), with the region being ascertainable by means of the calibrating antenna (310).

The measuring apparatus (1000) is devised such that the circuit (20) to be checked, which comprises an antenna (22) and an electronic component (24) coupled with the antenna (22), can be arranged in the measuring apparatus (1000) such that the antenna (22) of the circuit (20) and the calibrating antenna (310) are arranged coaxially with the transmitting antenna (210) and on respectively different sides of the transmitting antenna (210) and respectively at the same distance (d) from the transmitting antenna (210). The exciting coil (130) and the measuring antenna (140) are arranged orthogonally to each other. The transmitting device (200) is devised to generate an alternating magnetic field of different field strengths (H), preferably at least in the range of 0 to at least 12 A/m, particularly preferably in the range of 0.15 or 1.5 to 7.5 A/m.

The measuring antenna (140) comprises a conductor loop and a plurality of ohmic resistors (144), with the resistors (144) being inserted into the conductor loop at pre-specified distances along the conductor loop, with the distances preferably being the same between any pair of resistors (144) adjacent along the conductor loop. The are formed by the insertion of the resistors (144) into the conductor loop a plurality of line segments (142) of the conductor loop, with line segments (142) adjacent along the conductor loop being connected by one of the ohmic resistors (144) in each case, so that line segments (142) and resistors (144) are respectively switched alternately and in series.

The measuring antenna (140) is attached to an amplifier (150) with a preferably high-ohmic input. The amplifier (150) is designed as an impedance transducer whose output impedance is preferably adapted to a transfer means, preferably a coaxial cable (155), which connects the impedance transducer to the evaluation device (160). The evaluation device (160), preferably an oscilloscope, has an input impedance which is adapted to a transfer means, preferably a coaxial cable (155), which connects the evaluation device (160) to the measuring antenna (140).

The invention claimed is:

1. A method for checking a circuit devised for contactless data communication, which comprises an antenna and an electronic component coupled with the antenna, comprising the steps of:
generating an alternating magnetic field for the circuit;
exciting the circuit by means of an energy pulse,
capturing an oscillation of the circuit in response to the excitation by the energy pulse; and
evaluating the captured oscillation of the circuit;
wherein the generating of the alternating magnetic field is effected or temporarily interrupted during the exciting, and
wherein the evaluating of the captured oscillation is effected in dependence on the field strength of the alternating magnetic field in which the circuit is arranged.

2. The method according to claim 1, wherein arranging the circuit in the region of the alternating field.

3. The method according to claim 1, wherein the exciting of the circuit is effected as inductive exciting by means of a pulsed magnetic field, with the magnetic field being generated by a single current pulse.

4. The method according to claim 3, wherein the current pulse is generated as a direct-current pulse in the form of a Dirac impulse.

5. The method according to claim 1, wherein the exciting of the circuit is carried out contactlessly by means of an external exciting coil, and/or that the capturing of the oscillation of the circuit is carried out contactlessly by means of an external measuring coil.

6. The method according to claim 1, wherein the alternating field is generated by means of a transmitting antenna, and that the field strength of the alternating field is measured by means of a calibrating antenna in order to enable a generating of the alternating field according to a pre-specified field strength, with the calibrating antenna and the antenna of the circuit being arranged relative to the transmitting antenna such that an alternating magnetic field of the same field strength is respectively present in the region of the calibrating antenna and in the region of the antenna of the circuit.

7. The method according to claim 1, wherein the exciting of the circuit by the energy pulse is effected with the alternating magnetic field constantly present.

8. The method according to claim 7, wherein the capturing of the oscillation of the circuit comprises a capturing of a superimposition of a sinusoidal oscillation of the circuit brought about by the alternating field, with a free, damped oscillation of the circuit, with the free, damped oscillation resulting from the excitation by the energy pulse.

9. The method according to claim 8, wherein the evaluating of the captured oscillation of the circuit comprises a subtraction of the constant sinusoidal oscillation from the captured oscillation in order to ascertain the free, damped oscillation.

10. The method according to claim 9, wherein the subtraction of the constant sinusoidal oscillation from the captured oscillation is carried out by means of software or by means of hardware, in particular while employing an amplifier and/or by addition of a signal which corresponds to the signal captured by the calibrating antenna and inverted.

11. The method according to claim 1, wherein the alternating magnetic field is temporarily switched off, and that the exciting of the circuit by the energy pulse and the capturing of the oscillation of the circuit are effected with the alternating magnetic field switched off.

12. The method according to claim 11, wherein the alternating field is switched off only briefly, and the duration of the switch-off of the alternating magnetic field is so short that the circuit remains supplied with energy during the switch-off of the alternating field.

13. The method according to claim 11, wherein the excitation by means of the energy pulse with the alternating magnetic field switched off is effected only when the sinusoidal oscillation of the circuit resulting from the alternating field has decayed.

14. The method according to claim 13, wherein the capturing of the oscillation of the circuit corresponds to the capturing of the free, damped oscillation of the circuit.

15. The method according to claim 9, wherein in the evaluating step there is ascertained from the captured or ascertained free, damped oscillation of the circuit the self-resonant frequency and/or the quality factor of the circuit for the field strength (H) of the alternating magnetic field.

16. The method according to claim 1, wherein the method is repeated with a changed field strength of the alternating magnetic field.

17. The method according to claim 1, wherein in the evaluating step a field strength-dependent property of the circuit is determined for the generated field strength.

18. The method according to claim 1, wherein the evaluating of the captured oscillation is effected in dependence on an operating or switching state of one or more parts of the electronic component that is due to the presence of the alternating magnetic field.

19. An apparatus for checking a circuit devised for contactless data communication, which comprises an antenna and an electronic component coupled with the antenna, having:
  a transmitting device having a transmitting antenna which is devised to generate an alternating magnetic field for a circuit to be checked which is arrangeable in the measuring apparatus,
  a pulse means which is devised to additionally excite the circuit to be checked, and
  an evaluation means which is devised to evaluate an oscillation of the circuit to be checked which is captured in response to the excitation by the pulse means,
  wherein the apparatus is devised to either temporarily switch off or maintain the alternating magnetic field while the circuit is additionally excited, and
  wherein the evaluation of the captured oscillation is effected in dependence on the field strength of the alternating magnetic field in which the circuit is arranged.

* * * * *